United States Patent [19]

Williams et al.

[11] 3,964,156

[45] June 22, 1976

[54] ELECTRICAL SOLID-STATE DEVICES

[75] Inventors: Brian David Williams, Cogenhoe; David Perkins, Wootton; Dennis George Dale, Northampton, all of England

[73] Assignee: Plessey Handel und Investments A.G., England

[22] Filed: Mar. 25, 1975

[21] Appl. No.: 561,831

Related U.S. Application Data

[63] Continuation of Ser. No. 425,896, Dec. 18, 1973, abandoned.

[30] Foreign Application Priority Data

Feb. 24, 1973 United Kingdom.................. 9195/73

[52] U.S. Cl..................................... 29/579; 29/580; 156/8; 156/17; 427/91
[51] Int. Cl.².......................................... B01J 17/00
[58] Field of Search...................... 29/578, 579, 580; 427/91, 99; 156/8, 17

[56] References Cited
UNITED STATES PATENTS 3,438,121 4/1969 Wanlass................................ 29/579
3,758,943 9/1973 Shibata................................ 29/579

*Primary Examiner*—W. Tupman
*Attorney, Agent, or Firm*—Scrivener Parker Scrivener & Clarke

[57] ABSTRACT

A method of manufacturing an electrical solid-state device in which the separation of adjacent areas of film material is controlled at a low value. The method employs established photoengraving techniques, and exploits the undermining of edges of photo-resist when the film material is etched away. The etching action is continued after exposure of the substrate, until the wall of film material recedes sufficiently to give a stable wall profile and a margin of exposed substrate which is overhung by photo-resist. Further film material is deposited on the substrate, but the margin, being sheltered by the overhanging photo-resist, remains uncovered.

2 Claims, 11 Drawing Figures

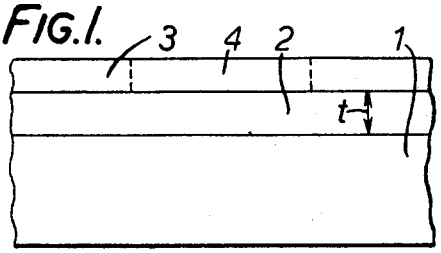
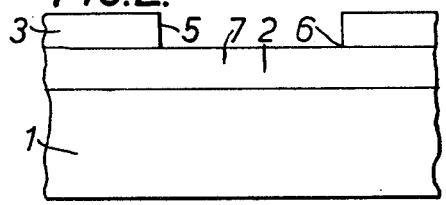
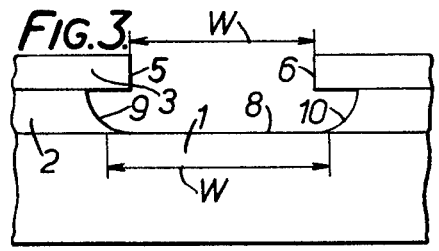
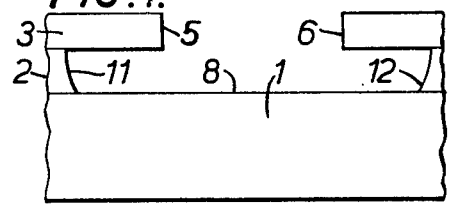
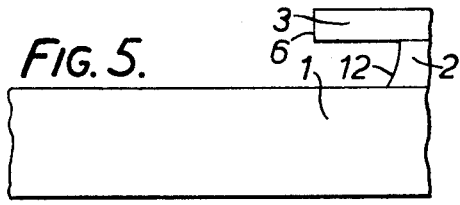
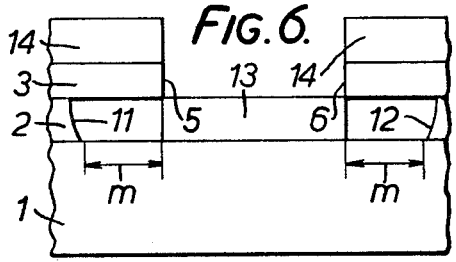
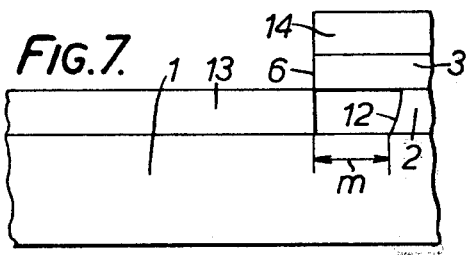
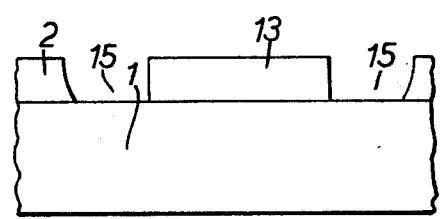
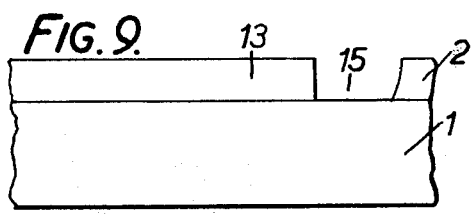
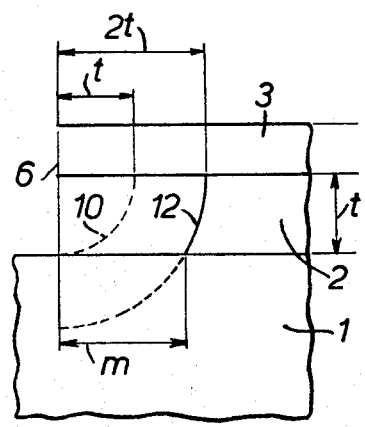
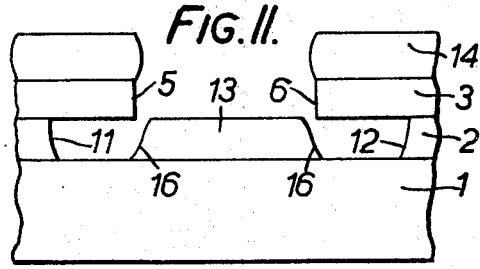

ELECTRICAL SOLID-STATE DEVICES

This is a continuation of application Ser. No. 425,896, filed Dec. 18, 1973, now abandoned.

This invention relates to electrical solid-state devices.

Electrical solid-state devices are known in which a film of film material is carried on a substrate. Frequently the film material has metallic or dielectric properties. It is a common practice to divide the film into a number of discrete areas or lands by means of demarcation lines. The demarcation lines are in fact narrow troughs, whose walls are composed of film material and whose floor is formed by the substrate.

The troughs are made by photoengraving techniques. The film is covered by a layer of photo-resist, and a trace of the trough is projected photographically onto the layer as a narrow band having two defined edges. After exposure to ultra-violet light, the photo-resist between the two edges is washed away, leaving the trace as a channel of defined width, whose floor is composed of film material. An etchant is then presented to the channel. The etchant attacks the film material, thereby forming the trough in the film. After the etching operation, the remainder of the photo-resist is removed.

The minimum trough width obtainable by this method is limited. In the first place, the trace width is limited to about one micron. If narrower traces are required, radiation must be used which has a wavelength shorter than ultra-violet light. This involves expensive apparatus and cumbersome methods. In the second place, the etchant, when forming the trough, attacks not only the trough floor but the walls of the trough as well. As a result, the trough width is ill defined, and for practical purposes has to be regarded as exceeding the trace width.

According to the invention there is provided a method of manufacturing an electrical solid-state device which includes the following five stages:
  i. forming on a substrate a film of film material having a given thickness;
  ii. covering the film with a layer of photo-resist;
  iii. photographically forming in said layer a trace channel having walls constituted by defined edges of photo-resist and a floor of film material;
  iv. forming a trough in the film material by presenting an etchant into the trace channel, whereby an etching action is started on the film material at the floor of the channel which action continues through the film thickness until such time as the substrate is exposed over a width equal to the width between said defined edges, an incidental etching action taking place during this time at the walls of the trough, which incidental action is deliberately continued after the expiry of said time for a spell during which the trough walls are caused to recede and to assume a profile dependent partly on the spell duration and partly on the film thickness, the recession of a wall forming at the floor of the trough a margin of exposed substrate material which is overhung by photo-resist; and
  v. introducing further film material from a source above the substrate and the photo-resist, whereby a film is re-formed on the substrate except at the margin which is overhung by the photo-resist.

It is known to make films whose thickness is substantially less than one micron. By means of such a film, the method enables a margin to be produced whose width is controlled at a value substantially less than one micron. And the margin becomes the floor of a trough which serves as a demarcation line between a first land comprising surviving original film material and a second land comprising film material deposited later in the process. Further, this substantial reduction in trough width is obtainable with ultra-violet light.

The invention will now be described with reference to the accompanying drawings in which:

FIGS. 1–9 are idealised sectional diagrams illustrating stages in the manufacture of a solid-state device by the method according to the invention, the stages represented by FIGS. 1–3 being already known, FIG. 10 is an enlarged detail, and FIG. 11 is a sectional diagram similar to FIG. 6 illustrating some conditions encountered in practice.

Referring to FIGS. 1–3 an electrical solid-state device, for example integrated circuit chip, comprises a substrate 1 supporting a film 2 of film material. The film material may have metallic or dielectric properties. In the drawings, hatching has been omitted for clarity. It is a common requirement that the film 2 should be divided into a number of discrete areas or lands. This is achieved by one or more demarcation lines, a demarcation line comprising a trough having walls of film material and a floor of substrate material.

To form a demarcation line, a layer 3 of photo-resist is spread over the film 2, and a trace 4 of the demarcation line is projected photographically on to the layer 3. The trace 4 is focussed to present a band of width $w$ which is sharply defined at the edges 5, 6. After exposure to light, the band material is washed away, leaving a channel 7 of width $w$ in the layer 3. The channel 7 has defined edges 5, 6 of photo-resist and a floor of film material.

To produce the demarcation line, an etchant is introduced into the channel 7. The etchant attacks the film material which forms the floor of the channel, to produce a trough 8 in the film 2. The etching action continues until the substrate 1 is exposed at the floor of the trough. The etchant however acts equally in all directions. So while the floor of the trough sinks towards the substrate, the film material at the sides of the trough is attacked as it becomes exposed. As a result the defined edges 5, 6 of the layer 3 of photo-resist are undermined. When the substrate 1 is exposed, the etchant is removed and the etching action is stopped. Measured along the underside of the layer 3, the edges 5, 6 have been undermined to an extent equal to the thickness $t$ of the film 2. The walls 9, 10 of the trough 8 therefore take the form quadrants of a circle of radius $t$. At the floor of the trough 8 the quadrants are tangential to the top of the substrate 1. Therefore the quantity of film material forming the walls at these points is very small and easily dislodged. Consequently the width of the trough 8 is not accurately controlled at the value $w$, and in practice must be regarded as having a rather greater width denoted by W.

Using ultra-violet light, the minimum trace width $w$ that can be achieved is of the order of one micron. If smaller widths are required, radiation of a shorter wave length must be used. While this is possible, cumbersome methods and expensive apparatus are involved. And even with the reduced widths, the undermining of the defined edges 5, 6 is still experienced.

By means of the method of the invention, a trough width substantially less than one micron is obtainable even if ultra-violet light is employed. And the reduced trough width is closely controlled by controlling the thickness $t$ of the film 2. For this purpose the film $t$ is given a thickness of substantially less than one micron. The film 2 of the required thickness is formed in any suitable known way. A trough 8 with walls 9, 10 is then formed in the manner just described. However, instead of stopping the etching action when the substrate 1 is exposed at the floor of the trough 8, the etching action is continued for a further spell during which the defined edges 5, 6 are further undermined as the walls 9, 10 recede. The duration of this further spell determines the extent of the additional undermining. At the expiry of this further spell, the etchant is removed and the etching action stopped. During this further spell, the walls 9, 10 have receded to 11, 12 respectively. The duration of the further spell is chosen, in relation to the thickness $t$ of the film 2, so as to produce a desired profile for the walls 11, 12. For example, if the duration of the further spell is made equal to the time taken to expose the substrate 1, the undermining of the defined edges 5, 6 is increased from $t$ to $2t$ (see FIG. 10). The wall 11 or 12 is an arc — not a quadrant — of a circle of radius $2t$. By suitably relating the duration of the further spell of etching to the thickness $t$ of the film 2, the walls 11, 12 are given a profile which forms an appreciable angle with the substrate 1, in contrast to the tangential contact of the walls 9, 10. Consequently the film material at the walls 11, 12 is not readily dislodged, and the walls 11, 12 retain their profile. During the further spell of etching, the recession of the walls 9, 10 to the positions 11, 12 caused the substrate 1 to be exposed over a margin $m$ at each side of the trough 8. The defined edges 5, 6 not being affected, the margins $m$ are each overhung by photo-resist 3.

After the walls, 11, 12 have been formed (FIG. 4), there follows an optional stage depending on whether one or two demarcation lines are required. If only one line is required, one wall of the trough 3 is removed together with the corresponding defined edge. Thus, in FIG. 5, the wall 11 and defined edge 5 have been removed in a suitable known way, leaving only the wall 12 and the defined edge 6.

A further supply of film material is now deposited from a source above the substrate 1 and photo-resist 3. On the substrate 1, the deposited material accumulates until a thickness $t$ is attained, at which juncture the supply is cut off. In this way a film 13 (FIGS. 6, 7) of film material is formed on the substrate 1, the film 13 having the same thickness as the film 2. While the film 13 is being formed, a redundant film 14 accumulates on top of the photo-resist 3. The margins $m$, being overhung by photo-resist 3, accumulate none of the deposited film material. Consequently a trough 15 of width $m$ is left between the original film material 2 and the deposited film material 13. Finally the photo-resist 3 and redundant films 14 are removed in a suitable known way, leaving a solid-state device as shown in FIG. 8 or 9.

Now it is known to form films having a thickness substantially less than one micron. To take a simple example, suppose the trace width $w$ is 1 micron, and the thickness $t$ of the film 2 is made one quarter of a micron. If the duration of the further spell of etching is equal to the initial etching time, the width $m$ of a trough 15 will approach the value $2t$, that is one half of a micron. This compares with the minimum width W obtainable by known methods employing ultra-violet light. As already explained the width W is necessarily greater than the trace width $w$ which, in this example, has been assumed to be one micron.

When the further supplies of film material are deposited, the edges of the films 13, 14 are not clear cut as suggested by FIG. 6. In practice, the film 14 tends to bulge slightly beyond the defined edges 5, 6. As a result there is a tendency for the edges 16 of the film 13 to depart from the vertical. This tendency, however, is predictable, and allowances can be made when choosing values for the thickness $t$ of the film 2 and the duration of the further spell of etching.

If the film material is metallic, the walls 11, 12 may be anodised if desired. Anodisation may encroach to a greater or lesser, but predictable, extent on the margin $m$.

It is to be understood that the foregoing description of specific examples of this invention is made by way of example only and is not to be considered as a limitation in its scope.

What is claimed is:

1. A method of manufacturing an electrical solid-state device comprising a substrate supporting a film material which is divided into lands by demarcation gaps in which method the width of the demarcation gaps is determined by the following stages:
   i. forming on a substrate a film or film material having a given thickness;
   ii. covering the film with a layer of photo-resist;
   iii. photographically forming in said layer a trace channel having walls constituted by defined edges of photo-resist and a floor of film material;
   iv. forming a trough in the film material by presenting an etchant into the trace channel, the etchant reducing the film thickness until such time as the substrate is exposed over a width equal to the width between said defined edges, the etchant performing an incidental etching action during this time at the walls of the trough;
   v. continuing the incidental action after the expiry of said time for a spell during which the trough walls are caused to recede to an extent dependent partly on the spell duration and partly on the film thickness, the recession of a wall forming at the floor of the trough a margin of exposed substrate material which is overhung by photo-resist, the width of the margin being dependent partly on the duration of said spell, and partly on the thickness of said film;
   vi. introducing further film material from a source above the substrate and the photo-resist, the introduced material forming on the substrate a deposit which replaces material which was removed by the etchant to form a trough, the photo-resist which overhangs the margin preventing the formation of a deposit at the margin, the margin serving as a floor of a demarcation gap separating the deposit from film material which was not attacked by the etchant, and
   vii. removing the entire photo-resist and redundant further film material deposited thereon, to leave the substrate supporting film material which is divided into lands by a demarcation gap having width of said margin.

2. A method as claimed in claim 1 in which a trace channel is formed by means of ultra-violet light.

* * * * *